United States Patent [19]

Reiffin

[11] Patent Number: 4,823,094

[45] Date of Patent: Apr. 18, 1989

[54] DUAL-BAND HIGH-FIDELITY AMPLIFIER

[76] Inventor: Martin G. Reiffin, 5439 Blackhawk Dr., Danville, Calif. 94526

[21] Appl. No.: 162,112

[22] Filed: Feb. 29, 1988

Related U.S. Application Data

[63] Continuation-in-part of Ser. No. 858,664, May 2, 1986, Pat. No. 4,728,903.

[51] Int. Cl.[4] .............................................. H03F 3/30
[52] U.S. Cl. ..................................... 330/263; 332/264
[58] Field of Search ............... 330/126, 151, 262, 263, 330/264, 265, 266, 267, 268, 269, 290, 271, 272, 273, 274

[56] References Cited

U.S. PATENT DOCUMENTS 3,725,727  4/1973  Waehner .......................... 330/126 X Primary Examiner—James B. Mullins

[57] ABSTRACT

The disclosed amplifier comprises a high-frequency power output stage for current amplification of the high-frequency signals and a separate low-frequency power output stage for current amplification of the low-frequency signals. Reactive coupling means, including either inductors or a capacitor or both, together with resistors, coact with the two output stages to provide a novel crossover circuit to transmit high-frequency signal to the amplifier output terminal and low-frequency signals to the inputs of the low-frequency output stage to drive the latter. Each output stage is disclosed as having its own power supply. Each output stage may thus be implemented with devices optimized for its respective frequency range, intermodulation distortion is substantially reduced, and similar benefits accrue in the design of the separate power supplies.

18 Claims, 4 Drawing Sheets

DUAL-BAND HIGH-FIDELITY AMPLIFIER

CROSS-REFERENCE

This application is a continuation-in-part of my prior copending application entitled "Class A High-Fidelity Amplifier", filed May 2, 1986, Ser. No. 858,664, issued Mar. 1, 1988, U.S. Pat. No. 4,728,903. The disclosure of said prior application is incorporated herein by reference.

FIELD OF THE INVENTION

This invention relates to transistor power amplifiers for high-fidelity music reproduction and other applications where high power output and inaudible amplifier distortion under rigorously critical listening conditions are required.

DESCRIPTION OF THE PRIOR ART

High-fidelity amplifiers in accordance with the prior art provide power amplification of both high-frequency signals and low-frequency signals in the same power output stage energized by the same power supply. The resulting disadvantages are several.

First, intermodulation distortion is substantially increased. When signals of different frequencies are amplified by a nonlinear device there are generated distortion components comprising sum and difference frequencies of the original signals. Since these distorion components are not harmonically related to the original signal frequencies, music reproduction with even small amounts of intermodulation distortion is less than euphonic.

Second, amplification of both high-frequency and low-frequency signals in the same power output stage requires that the output transistors be compromised to handle both frequency ranges rather optimised for either high-frequency or low-frequency signals. The desirable transistor design parameters for one frequency range are incompatible with those for the other frequency range so that the resulting trade-offs necessarily result in the selection of transistor types which are less than optimum.

More particularly, low-frequency signals require large amounts of power which in turn require large devices to provide high power ratings. On the other hand, high-frequency transistors must be small. That is, the base width must be narrow to reduce the transit time, and the emitter and collector areas must be small to reduce the junction capacitances. The design and dimensions of transistors for high frequencies are therefore incompatible with those for low frequencies.

Third, amplification of both high-frequency and low-frequency signals in the same power output stage requires that power for both frequency ranges be provided by the same power supply. Here again, the result is increased intermodulation distortion and compromises in the design of the power supply.

SUMMARY OF THE INVENTION

It is therefore a primary object of the present invention to eliminate the above-noted disadvantages of prior art high-fidelity amplifiers by providing a novel circuit wherein separate power output stages are provided for high-frequency and low-frequency signals.

High-frequency signal currents are amplified by a first power output stage and transmitted directly to the amplifier output terminal through a resistor or capacitor. The first output stage also serves as a low-frequency drive stage for a second power output stage which provides current amplification for the low-frequency signals. For this purpose the two stages are coupled by an inductive or resistive network. If warranted by the additional expense, a separate power supply may be provided for each of the two power output stages.

The terms "high-frequency" and "low-frequency" as used in the specification and claims are merely relative and indicate whether the signal frequency is above or below the crossover frequency delineating the upper and lower frequency ranges. For example, if the crossover frequency is 100 Hz then a signal frequency of 200 Hz would be a "high-frequency" signal. On the other hand, if the crossover frequency is 400 Hz then the same 200 Hz signal would be a "low-frequency" signal.

DETAILED DESCRIPTION

Circuit Topology

Figure 1:
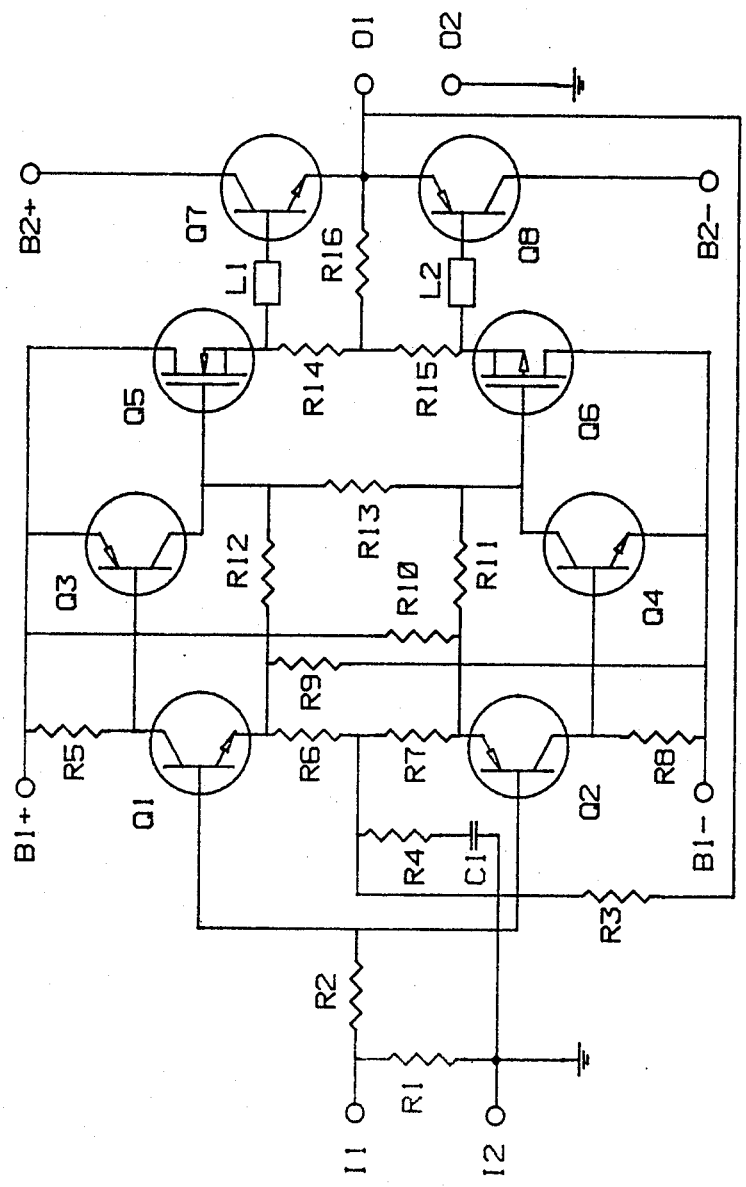
FIG. 1 is a schematic circuit diagram showing an embodiment of the invention wherein low-frequency signals are transmitted to the input terminals of the low-frequency output stage by inductors, and also shows the novel input and drive stages previously disclosed in said prior copending application.

Referring now to the drawings in more detail, FIG. 1 shows an amplifier circuit in accordance with the present invention and comprising an input stage Q1, Q2, a drive stage Q3, Q4, a high-frequency output stage Q5, Q6 and a low-frequency output stage Q7, Q8. The high-frequency output stage transistors Q5, Q6 are preferably MOSFET (metal oxide semiconductor field-effect transistor) devices, whereas the low-frequency output stage transistors Q7, Q8 are preferably bipolar devices. The input stage transistors Q1, Q2 and drive stage transistors Q3, Q4 are shown as bipolar devices but may instead be field-effect devices.

A hot input terminal I1 is connected through resistor R2 to the respective bases of input stage transistors Q1, Q2. The other input terminal I2 is grounded. A resistor R1 extends between input terminal I1 and the ground at terminal I2. An input signal may be applied to terminals I1, I2 by connecting the latter to the output of a preamplifier (not shown) or other suitable source.

Input stage transistors Q1, Q2 are complementary, with transistor Q1 shown as NPN polarity and transistor Q2 as PNP. The collector of transistor Q1 is connected through load resistor R5 to the positive terminal B1+ of a first power supply and the collector of transistor Q2 is similarly connected through load resistor R8 to the negative terminal B1− of said first power supply.

The emitters of input transistors Q1, Q2 are connected to the respective ends of resistors R6, R7 having their other ends connected to form a feedback signal injection node for the outer feedback network comprising resistors R3, R4 and capacitor C1. Feedback resistor R3 extends from a hot output terminal O1 to the junction of resistors R4, R6, R7 and capacitor C1 is in series with resistor R4 and the ground. A current source resistor R9 extends from the emitter of input transistor Q1 to the negative power supply terminal B1− and another current source resistor R10 similarly extends from the emitter of input transistor Q2 to the positive power supply terminal B1+.

Drive stage transistors Q3, Q4 are complementary with transistor Q3 shown as type PNP and transistor Q4 as type NPN. The base of drive transistor Q3 is direct-coupled to the collector of input transistor Q1 and the base of drive transistor Q4 is direct-coupled to the base of input transistor Q2. The emitter of drive transistor Q3 is connected to the positive power supply terminal B1+ and the emitter of drive transistor Q4 is connected to the negative power supply terminal B1−.

A load resistor R13 extends between the collectors of drive transistors Q3, Q4. Also connected to these collectors are the respective ends of feedback resistors R11, R12 having their other ends connected to the emitters of input transistors Q1, Q2 so as to form an inner feedback network.

Output stage MOSFET transistors Q5, Q6 are complementary and have their gates direct-coupled to the collectors of drive transistors Q3, Q4 respectively. the drain of high-frequency output transistor Q5 is connected to the positive power supply terminal B1+ and the drain of high-frequency output transistor Q6 is connected to the negative power supply terminal B1−.

The source of high-frequency output transistor Q5 is connected to one end of a resistor R14 and the source of high-frequency output transistor Q6 is connected to one end of a resistor R15. The other ends of resistors R14, R15 are connected to one end of a resistor R16 having its other end direct-coupled to the hot output terminal O1. The other output terminal O2 is grounded. Resistors R14, R15, R16 are preferably noninductive.

Low-frequency output stage Q7, Q8 comprises a complementary pair of bipolar transistors having their emitters direct-coupled to the hot output terminal O1. The bases of transistors Q7, Q8 are direct-coupled to the respective sources of high-frequency output transistors Q5, Q6, and the collectors of transistors Q7, Q8 are connected to the respective terminals B2+, B2− of a second power supply.

Figure 2:
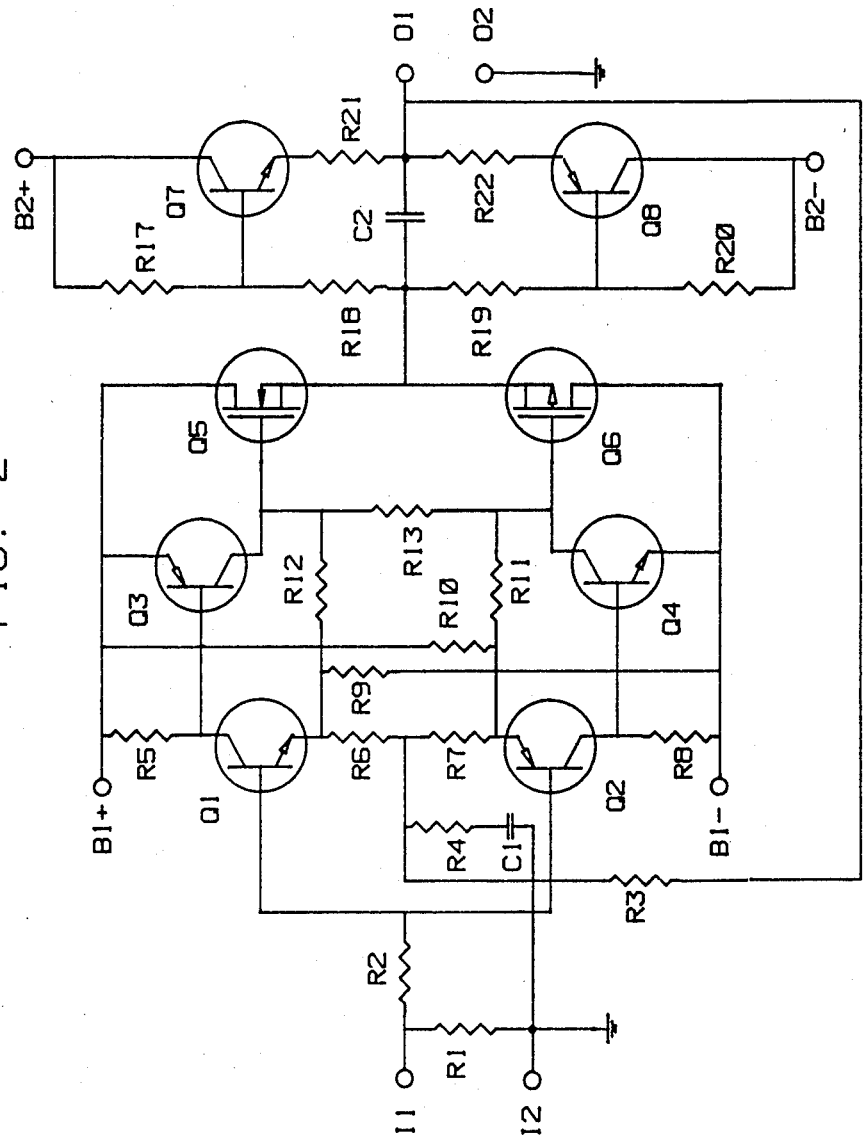
FIG. 2 is a similar circuit diagram of an embodiment wherein high-frequency signals are transmitted to the amplifier output terminal by a capacitor.

Referring now to FIG. 2, there is shown an embodiment of the invention wherein the reactive coupling is capacitive rather than inductive as in FIG. 1.

More specifically the input stage Q1, Q2 and drive stage Q3, Q4 of FIG. 2 are identical to those of FIG. 1 and the corresponding components are designated by the same reference numerals in both FIGURES. The high-frequency output stage Q5, Q6 is the same in both FIGURES except that resistors R14, R15 have been omitted in FIG. 2.

The low-frequency output transistors Q7, Q8 in FIG. 2 are biased by resistor pairs R17, R18 and R19, R20 respectively. Resistor R17 extend from power supply positive terminal B2+ to the base of transistor Q7 and resistor R18 extends from said base to the node joining the source terminals of transistors Q5, Q6. Resistor R19 extends from said node to the base of transistor Q8 and resistor R20 extends from the latter base to power supply negative terminal B2−.

The reactive coupling comprises a capacitor C2 having one end connected to the source terminals of transistors Q5, Q6 and its other end connected to output terminal O1. Capacitor C2 is preferably a polypropylene type. Also connected to terminal O1 are resistors R21, R22 extendings to the respective emitters of transistors Q7, Q8. The collectors of the latter are connected to respective power supply terminals B2+, B2−.

Figure 3:
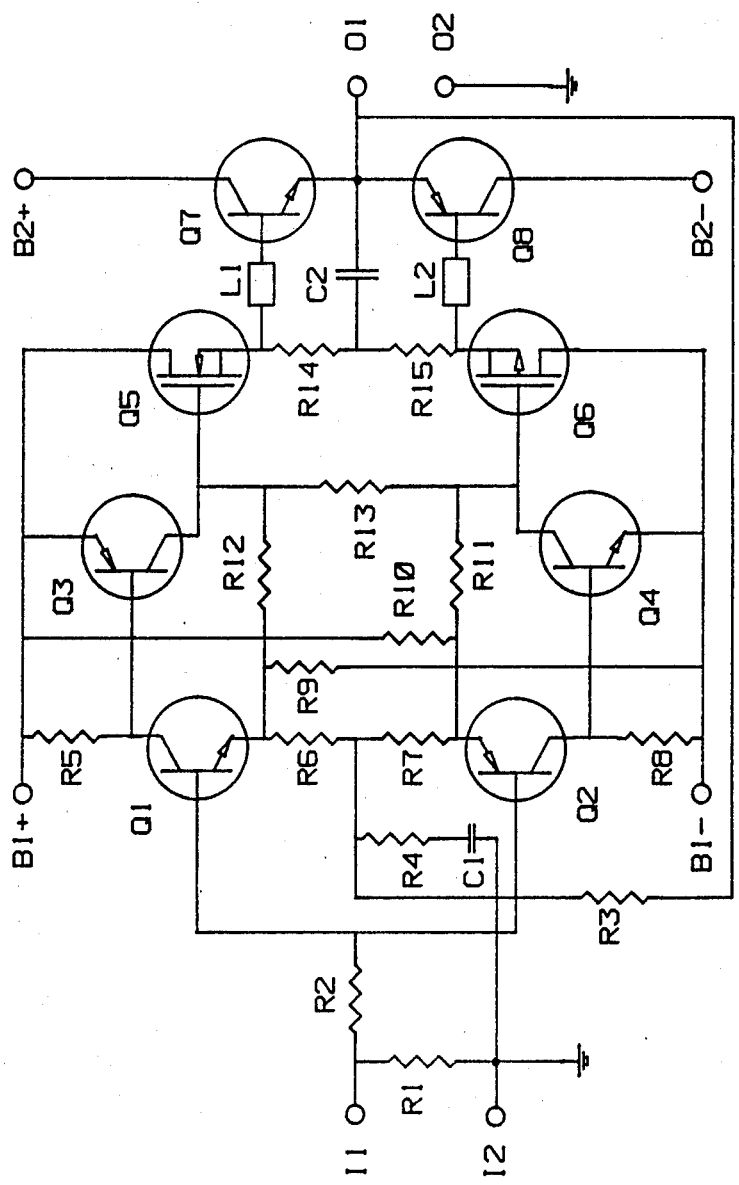
FIG. 3 shows an embodiment combining the inductive coupling of FIG. 1 with the capacitive coupling of FIG. 2.

Referring now to FIG. 3 there is shown an embodiment of the invention comprising both the inductive coupling of FIG. 1 and the capacitive coupling of FIG. 2. This is achieved by merely substituting a capacitor C2 for the resistor R16 of FIG. 1.

Figure 4:
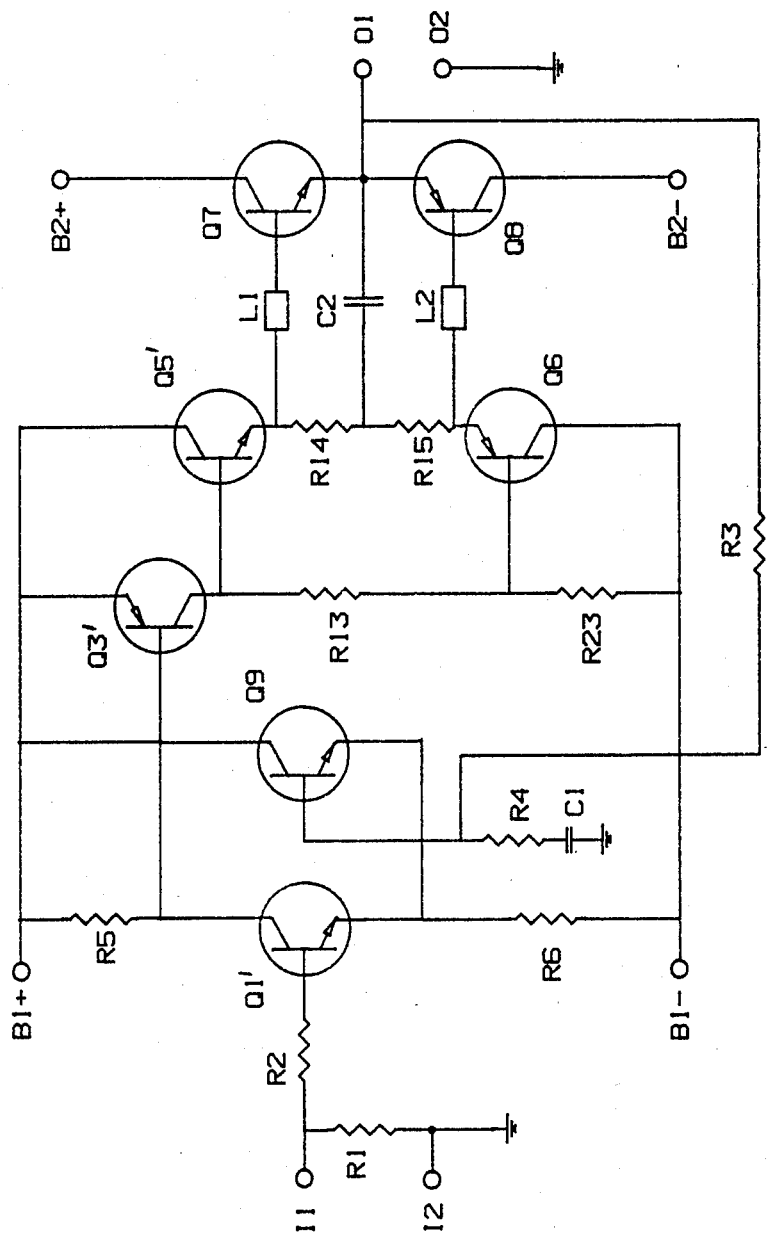
FIG. 4 shows an embodiment having the same reactive coupling means of FIG. 3 but with a bipolar high-frequency output stage and conventional input and drive stages.

The embodiment of FIG. 4 also comprises the combined inductive and capacitive couplings as shown in FIG. 3. However, FIG. 4 differs from all of the other disclosed embodiments in that the high-frequency output stage utilizes bipolar transistors Q5', Q6' and the input and drive stages are conventional.

More specifically, the common-emitter input stage of FIG. 4 comprises the usual differential emitter-coupled pair of bipolar NPN transistors Q1', Q9. Resistor R2 extends from hot output terminal I1 to the base of transistor Q1'. Load resistor R5 extends from power supply positive terminal B1+ to the collector of transistor Q1'. Current source resistor R6 extends from the coupled emitters of transistors Q1', Q9 to power supply negative terminal B1−.

The collector of the second input stage transistor Q9 is connected to power supply positive terminal B1+ and its base is substantially A.C.-coupled to ground by the series arrangement of resistor R4 and capacitor C1.

The drive stage of FIG. 4 comprises a PNP bipolar transistor Q3' connected in the common-emitter mode with its base direct-coupled to the collector of input transistor Q1' and its emitter connected to power supply positive terminal B1+. A bias resistor R13 and a collector load resistor R23 are connected in series between the collector of drive transistor Q3' and power supply negative terminal B1−. The collector of transistor Q3' is direct-coupled to the base of high-frequency output transistor Q5' and the junction of resistors R13, R23 is direct-coupled to the base of high-frequency output transistor Q6'.

High-frequency output transistors Q5', Q6' are complementary and have their collectors connected to the respective power supply terminals B1+, B1−. Resistors R14, R15 extend from the respective emitters of transistors Q5', Q6' to one end of capacitor C2 having its opposite end connected to output terminal O1. Inductors L1, L2 extend from said emitters to the respective bases of low-frequency output transistors Q7, Q8. This output stage is identical to its counterpart in FIG. 3.

Operation

The output signal of a preamplifier (not shown) or other high-level source is applied as an input signal to the input terminals I1, I2 of the disclosed amplifier. This input signal is transmitted through resistor R2 to the respective bases of input transistors Q1, Q2. These operate in the Class A common-emitter mode so that an amplified signal appears at their collectors. The latter are direct-coupled to the respective bases of drive transistors Q3, Q4. These transistors also operate in the Class A common-emitter mode so that the signal is further amplified at the collectors of drive transistors Q3, Q4. The signal is then transmitted to the gates of MOSFET high-frequency output transistors Q5, Q6.

MOSFET high-frequency output transistors Q5, Q6 provide current amplification for the high-frequency components of the signal which components then flow through current sensing resistors R14, R15, R16 to output terminal O1.

High-frequency output transistors Q5, Q6 also serve as a drive stage for the low-frequency components of the signal which components are then transmitted to the bases of low-frequency output transistors Q7, Q8 through inductors L1, L2. The low-frequency components also flow through resistors R14, R15, R16 to generate voltage drops across these resistors. These voltage drops coact with the low-frequency signals flowing through inductors L1, L2 to vary the base-emitter junction voltages of transistors Q7, Q8 in accordance with the low-frequency signal components. Transistors Q7, Q8 provide current amplification of the low-frequency signals which are then transmitted to output terminal O1 and to the loudspeaker (not shown) connected to the latter.

Describing the coaction of the high-frequency and low-frequency output stages in more detail, assume first that a low-frequency signal at the collectors of drive transistors Q3, Q4 is positive with respect to ground. Since high-frequency output transistors Q5, Q6 operate in the source-follower mode the potential of the source terminal of high-frequency output transistor Q5 will also be positive with respect to ground.

The low-frequency signal current will then flow from the source of output transistor Q5 through inductor L1 to the base of low-frequency output transistor Q7, and also through resistors R14, R15, so as to increase the forward bias of the base-emitter junction of low-frequency output transistor Q7 and to reduce the forward bias of the base-emitter junction of the other low-frequency output transistor Q8. The magnitude of this bias increment is directly proportional to the magnitude of the low-frequency signal and increases the current flowing from power supply terminal B2+ through output transistor Q7 to output terminal O1.

Negative excursions of the low-frequency signal at the collectors of drive transistors Q3, Q4 will similarly cause high-frequency output transistor Q6 to drive low-frequency output transistor Q8 through inductor L2 and resistors R15, R16 to cause low-frequency signal current to flow in the opposite direction from output terminal O1 through low-frequency output transistor Q8 to power supply negative terminal B2−.

High-frequency signals are blocked from the bases of the low-frequency output transistors Q7, Q8 by inductors L1, L2. The latter thus coact with resistors R14, R15, R16 to form a reactive coupling which bypasses high-frequency signals away from the bases of low-frequency output transistors Q7, Q8 and instead transmits these high-frequency signals to the output terminal O1.

The operation of the embodiment of FIG. 2 is similar to that described above with respect to FIG. 1 except that the reactive coupling is provided by capacitor C2 which transmits high-frequency signals directly from the source terminals of high-frequency output transistors Q5, Q6 to output terminal O1. Since capacitor C2 is a low impedance "short" for high-frequency signals no significant high-frequency signal voltage is generated across the capacitor and therefore the base-emitter junction voltages of low-frequency output transistors Q7, Q8 remain substantially unaffected by the high-frequency signals.

On the other hand, capacitor C2 presents a substantial reactance to low-frequency signals which cause a voltage drop across capacitor C2 so as to vary the base-emitter junction voltages of low-frequency output transistors Q7, Q8. High-frequency output transistors Q5, Q6 serve as a low-frequency drive stage for output transistors Q7, Q8. The latter operate in the emitter-follower mode to provide current amplification of the low-frequency signals which are then transmitted to output terminal O1 and the loudspeaker system (not shown) connected thereto.

The operation of the embodiments of FIGS. 3 and 4 will be understood from the above described modes of operation of FIGS. 1 and 2, since each of FIGS. 3 and 4 combines the inductive coupling circuit comprising inductors L1, L2 of FIG. 1 with the capacitive coupling circuit comprising capacitor C2 of FIG. 2. Each of these reactive coupling circuits is in effect a first-order filter, and the combination of both circuits is a second-order filter having twice the rolloff rate of either first-order filter separately.

The operation of the conventional input stage Q1', Q9 and conventional drive stage Q3' of FIG. 4 is well-known and is disclosed in applicant's U.S. Pat. No. Re. 29,273 reissued June 21, 1977.

The specific embodiments shown in the drawing are merely illustrative of several of the many forms which the invention may take in practise and numerous modifications thereof will readily occur to those skilled in the art, such as, for example, the following:

The term "two-way" as used throughout the specification and claims is intended to include multiway amplifiers having two or more output stages each amplifying a particular frequency range. That is, the frequency spectrum may be divided into two, three or more ranges, each with a separate output stage. For clarity of description only two ranges are disclosed in the preferred embodiments of the detailed description.

The Class A configuration of said prior copending application incorporated herein by reference may be utilized in combination with the present invention. That is, a Class A output stage together with a Class B or Class C current amplification stage, in accordance with said prior application, may be substituted for the high-frequency output stage Q5, Q6 of the present application so as to amplify the high-frequency signals and serve as a drive stage for the low-frequency signals to be amplified by the low-frequency output stage Q7, Q8.

A complementary push-pull emitter-follower stage may be inserted between drive stage Q3, Q4 and output stage Q5, Q6. The inner feedback network R11, R12 may be eliminated, if desired. The bases of this additional emitter-follower stage would be respectively direct-coupled to the collectors of drive transistors Q3, Q4 and the emitters of this additional stage would be respectively direct-coupled through conventional gate resistors to the gate terminals of MOSFET output transistors Q5, Q6.

Active current sources may be substituted for load resistors R5, R8 and/or source resistors R9, R10.

A cascode pair of transistors may be substituted for each of the input stage transistors Q1, Q2 and/or each of the drive stage transistors Q3, Q4.

A normally-reverse-biased diode may be located in parallel with each of the inductors L1, L2 to accelerate the turnoff time of low-frequency output transistors Q7, Q8 by quickly removing the excess carrier charges stored in the base regions of these transistors, since in some applications such stored charge removal might otherwise be too slow in view of the inductive reactance of inductors L1, L2.

The term "base/gate" is generic to include either the base of a bipolar transistor or the gate of a field-effect transistor. Similarly, the term "emitter/source" is generic to include either the emitter of a bipolar transistor or the source of a field-effect transistor.

Other modifications will be obvious to those skilled in the art without departing from the scope of the invention as delineated by the appended claims which are to be interpreted as broadly as permitted by the prior art.

I claim:

1. A two-way high fidelity amplifiers for the reproduction of music without audible distortion and comprising
   a single-ended push-pull high-frequency output stage,
   a single-ended push-pull low-frequency output stage,
   a drive stage for transmitting both high-frequency and low-frequency signals to said high-frequency output stage,
   an output terminal for connection to a loudspeaker system,
   reactive coupling means for transmitting high-frequency signals from the high-frequency output stage to the output terminal and for transmitting low-frequency signals from the high-frequency output stage to the low-frequency output stage, and
   direct-current coupling means for transmitting low-frequency signals from the low-frequency output stage to the output terminal.

2. An amplifier as recited in claim 1 wherein said reactive coupling means comprises capacitive coupling means extending from said high-frequency output stage to said output terminal.

3. An amplifier as recited in claim 1 wherein said reactive coupling means comprises inductive coupling means extending from said high-frequency output stage to said low-frequency output stage and further comprises resistive means extending from said high-frequency output stage to said output terminal.

4. An amplifier as recited in claim 1 wherein said reactive coupling means comprises
   capacitive coupling means extending from said high-frequency output stage to the output terminal, and
   inductive coupling means extending from said high-frequency output stage to said low-frequency output stage.

5. A two-way high fidelity amplifier for the reproduction of music without audible distortion and comprising
   a single-ended push-pull high-frequency output stage including a pair of transistors each having an input terminal and an output terminal,
   a single-ended push-pull low-frequency output stage including a pair of transistors each having an input terminal and an output terminal,
   a drive stage for transmitting both high-frequency and low-frequency signals to the input terminals of said high-frequency output stage,
   an amplifier output terminal for connection to a loudspeaker system,
   first impedance means extending from the output terminals of said high-frequency output stage to the amplifier output terminal for transmitting high-frequency output signals to said loudspeaker system,
   second impedance means extending from the output terminals of said high-frequency output stage to the input terminals of said low-frequency output stage for transmitting low-frequency drive signals to said low-frequency output stage to drive the latter, and
   means direct-current coupling the output terminals of said low-frequency output stage to the amplifier output terminal for transmitting low-frequency output signals to said loudspeaker system.

6. An amplifier as recited in claim 5 wherein said first impedance means comprises capacitive coupling means extending from the output terminals of said high-frequency output stage to said amplifier output terminal.

7. An amplifier as recited in claim 5 wherein said second impedance means comprises inductive coupling means extending from the output terminals of said high-frequency output stage to the input terminals of said low-frequency output stage.

8. An amplifier as recited in claim 5 wherein said two impedance means comprise
   capacitive coupling means extending from the output terminals of said high-frequency output stage to the amplifier output terminal, and
   inductive coupling means extending from the output terminals of said high-frequency output stage to the input terminals of said low-frequency output stage.

9. A dual-band high fidelity amplifier for the reproduction of music without audible distortion and comprising
   a single-ended push-pull high-frequency output stage including a complementary pair of field-effect transistors each having a gate and a source,
   a single-ended push-pull low-frequency output stage including a pair of bipolar transistors each having a base and an emitter,
   a drive stage for transmitting both high-frequency and low-frequency signals to each gate of said high-frequency output stage,
   an amplifier output terminal for connection to a loudspeaker system,
   reactive coupling means for transmitting high-frequency signals from each source of said high-frequency output stage to the amplifier output terminal and for transmitting low-frequency signals from each source of said high-frequency output stage to a respective base of said low-frequency output stage, and
   direct-current coupling means for transmitting low-frequency signals from each emitter of sid low-frequency output stage to the amplifier output terminal.

10. An amplifier as recited in claim 9 wherein said reactive coupling means comprises capacitive coupling means extending from each source of said high-frequency output stage to said amplifier output terminal.

11. An amplifier as recited in claim 9 wherein said reactive coupling means comprises inductive coupling means extending from each source of said high-frequency output stage to a respective base of said low-frequency output stage and further comprises resistive means extending from each source to said output terminal.

12. An amplifier as recited in claim 9 wherein said reactive coupling means comprises
   capacitive coupling means extending from each source of said high-frequency output stage to the amplifier output terminal, and inductive coupling means extending from each source of said high-frequency output stage to a respective base of said low-frequency output stage.

13. An amplifier as recited in claim 9 wherein said reactive coupling means comprises first impedance means extending from each source of said high-frequency output stage to the amplifier output terminal for transmitting high-frequency output signals to said loudspeaker system, and second impedance means extending from each source of said high-frequency output stage to a respective base of said low-frequency output stage for transmitting low-frequency drive signals to said low-frequency output stage to drive the latter.

14. An amplifier as recited in claim 13 wherein said first impedance means comprises a capacitor.

15. An amplifier as recited in claim 13 wherein said second impedance means comprises an inductor.

16. An amplifier as recited in claim 13 wherein said first impedance means comprises a capacitor, and said second impedance means comprises an inductor.

17. An amplifier as recited in claim 9 and comprising a complementary-symmetry push-pull common-emitter input stage including a pair of transistors each having a collector, a complementary-symmetry push-pull common-emitter drive stage including a pair of transistors each having a base and a collector, means direct-current-coupling each of said input stage transistor collectors to a respective one of said drive stage transistor bases, and means direct-current-coupling each of said drive stage transistor collectors to a respective one of said high-frequency output stage transistors.

18. An amplifier as recited in claim 17 wherein each of said input stage transistors has an emitter, a power suply having positive and negative terminals, and a pair of current sources each extending from a respective one of said power supply terminals to a respective one of said input stage transistor emitters.

* * * * *